(12) United States Patent
Light et al.

(10) Patent No.: US 8,883,372 B2
(45) Date of Patent: Nov. 11, 2014

(54) RETICLE WITH COMPOSITE POLARIZER AND METHOD OF SIMULTANEOUS OPTIMIZATION OF IMAGING OF A SET OF DIFFERENT PATTERNS

(75) Inventors: Scott Light, Boise, ID (US); Dan Millward, Boise, ID (US); Anton Devilliers, Boise, ID (US); Yuan He, Boise, ID (US); Michael Hyatt, Boise, ID (US); Lijing Gou, Boise, ID (US); Kaveri Jain, Boise, ID (US); Zishu Zhang, Boise, ID (US); Jianming Zhou, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 74 days.

(21) Appl. No.: 13/489,437

(22) Filed: Jun. 5, 2012

(65) Prior Publication Data
US 2013/0323628 A1    Dec. 5, 2013

(51) Int. Cl.
*G03F 1/00* (2012.01)
(52) U.S. Cl.
USPC .................................................. 430/5
(58) Field of Classification Search
CPC ............................................ G03F 1/00–1/92

USPC ............................................................ 430/5
See application file for complete search history.

(56) References Cited

U.S. PATENT DOCUMENTS

| | | | | |
|---|---|---|---|---|
| 7,560,199 B2 * | 7/2009 | Tan et al. | | 430/5 |
| 7,799,486 B2 * | 9/2010 | Sarma et al. | | 430/5 |
| 7,947,431 B2 * | 5/2011 | Sarma et al. | | 430/311 |
| 2006/0216615 A1 * | 9/2006 | Goldstein et al. | | 430/5 |
| 2006/0286460 A1 * | 12/2006 | Huh et al. | | 430/5 |
| 2007/0092839 A1 * | 4/2007 | Tan et al. | | 430/311 |
| 2007/0127024 A1 | 6/2007 | Nomura | | |
| 2007/0264581 A1 * | 11/2007 | Schwarz | | 430/5 |

FOREIGN PATENT DOCUMENTS

TW    201013320    4/2010

* cited by examiner

*Primary Examiner* — Stewart Fraser
(74) *Attorney, Agent, or Firm* — Winston Hsu; Scott Margo

(57) ABSTRACT

A reticle with a composite polarizer includes: a transparent substrate; a patterned layer disposed on said transparent substrate; and a polarizing filter disposed on said transparent substrate, wherein said transparent substrate is substantially transparent with respect to illumination light, said patterned layer is partially opaque with respect to said illumination light, and said polarizing filter is capable of selectively polarizing said illumination light.

18 Claims, 13 Drawing Sheets

RETICLE WITH COMPOSITE POLARIZER AND METHOD OF SIMULTANEOUS OPTIMIZATION OF IMAGING OF A SET OF DIFFERENT PATTERNS

BACKGROUND OF THE INVENTION

1. Field of the Invention

The present invention generally relates to a reticle with a polarizer. In particular, the present invention relates to a reticle, i.e. a photo mask with one or more polarizers to selectively filter illumination light, that is, the light from the illumination source of a photo scanner illuminator when the illumination light passes through the polarizer in a semiconductor photolithography process. The reticle of the present invention allows the individual optimization of the polarization state of the light for each pattern on a same reticle to be processed without employing a special illuminator to optimize the illumination source shape locally for those patterns.

2. Description of the Prior Art

As the integration of ICs increases, the critical dimension of semiconductors becomes smaller. Therefore, it is desirable to increase the resolution limit of optical exposure tools. A conventional method for improving resolution includes the steps of: off-axis illumination, immersion lithography and increasing the numerical aperture of the lens. Applying polarization to the source illumination can further improve the imaging contrast. Different parts of the source illumination can use different polarization states.

In general, a photo mask, or called a reticle, is composed of a mask substrate, a opaque patterned layer, such as Chrome (Cr), and/or a partially transmissive patterned layer, such as molybdenum silicide (MoSi). The mask substrate can be a quartz substrate, and the patterned layer(s) covers the quartz substrate and has a pattern to be transferred to the wafer. The illumination source can be polarized into two modes: transverse-electric (TE) mode and transverse-magnetic (TM) mode.

Generally speaking, polarized light with high NA (numerical aperture) and an off-axis illumination (like dipole one) is employed to transfer very small repeating features onto a wafer. For example, light of 193 nm wavelength and immersion scanners use polarized light to improve image log-slope (ILS) at high NA. With both TM & TE components in the light, when the light incident angle becomes bigger, the contrast of a line/space pattern image from the TM fraction of the light drops drastically.

In the semiconductor field, in order to obtain the best imaging results for each individual pattern on a mask, some special illuminators may be used to optimize the illuminator's source shape of light for all patterns. Although this is the standard industrial approach, the introduction of the special illuminators usually leads to a trade-off in best imaging of individual pattern.

Further, the introduction of the special illuminator also has some negative influence on the production cost. Accordingly, another approach is still needed to obtain the best imaging results for each individual pattern without the adverse consequence encountered in the conventional methods.

SUMMARY OF THE INVENTION

The present invention in a first aspect provides a reticle with a polarizer to enable a new approach to obtain the best imaging results for each individual pattern. The reticle of the present invention includes a transparent substrate, a patterned layer, and a polarizing filter layer. The patterned layer is disposed on the transparent substrate on one of its top-down sides. The transparent substrate is substantially transparent with respect to an illumination light and the patterned layer is at least substantially partially opaque or partially transmissive with respect to the illumination light. The polarizing filter layer may be disposed on the same top-down side of the transparent substrate via three possible process options. For example, immediately below, immediately above, or within the patterned layer. During an exposure, the wavefront of the illumination light passes through the transparent reticle substrate then arrives at the mask pattern layer and the polarizing filter simultaneously, since the distance in the light path between the polarizing filter and the mask pattern is optically negligible in all three options.

In one embodiment of the present invention, the polarizing filter is made of material that is electrically conductive, such as Chrome (Cr) and molybdenum silicide (MoSi).

In another embodiment of the present invention, the polarizing filter is a wire-grid polarizer. For example, the polarizing filter has a line pitch and a line width. The line width may be smaller than 40 nm and the line pitch may be in a range between 80 nm to 120 nm on the reticle for an ArF laser 193 nm wavelength scanner.

In another embodiment of the present invention, illumination light has an incident wavelength and the line pitch is much smaller than the incident wavelength.

In another embodiment of the present invention, the XY position of the polarizing filter overlaps the position of the patterned layer.

In a second aspect, the present invention provides a reticle with multiple polarizers to enable a new approach to obtain the best imaging results for each individual pattern. The reticle of the present invention includes a transparent substrate, a patterned layer, and a layer of multiple polarizing filters. The patterned layer is disposed on the transparent substrate. The transparent substrate is substantially transparent with respect to illumination light but the patterned layer is substantially opaque or partially transmissive with respect to illumination light. The multiple polarizing filters are disposed on the same side of the transparent substrate of the patterned layer to polarize the illumination light at several different XY regions (X-Y plane).

In one embodiment of the present invention, the polarizing filters include a first polarizing filter and a second polarizing filter which are both electrically conductive. Both polarizing filters are on the same side of the reticle but are geographically apart.

In another embodiment of the present invention, both polarizing filters are wire-grid polarizer. For example, the polarizing filters have a line pitch and a line width. The line width may be smaller than 40 nm and the line pitch may be in a range between 80 to 120 nm on the reticle for an ArF laser 193 nm wavelength scanner.

In another embodiment of the present invention, the illumination light has an incident wavelength and the line pitch is much smaller than the incident wavelength.

In another embodiment of the present invention, the XY positions of the first polarizing filter and the second polarizing filter respectively overlap with the XY positions of the first region and the second region of the patterned layer that is on the same side of the transparent substrate.

In another embodiment of the present invention, the first polarizing filter and the second polarizing filter may have different orientations.

In another embodiment of the present invention, the reticle of the present invention may further include a first region of a first pattern and a second region of a second pattern. The first region of the first pattern is disposed within the patterned layer and has the first polarizing filter. The second region of the second pattern is disposed within the patterned layer and has the second polarizing filter. The second pattern is different from the first pattern. The first region and the second region are geographically apart.

In a third aspect the present invention provides a method of simultaneous optimization of imaging of a set of different patterns. First, a reticle and an illumination light are provided. The reticle of the present invention includes a transparent substrate, a patterned layer, and one or more polarizing filters. The patterned layer is disposed on the transparent substrate and has a first region of a first pattern and a second region of a second pattern different from the first pattern. The transparent substrate is substantially transparent with respect to illumination light and the patterned layer is at least substantially partially opaque such as only partially transmissive to illumination light. One or more polarizing filters are disposed on the transparent substrate and capable of polarizing illumination light. The illumination light passes through one or more polarizing filters and the patterned layer so that the illumination light is selectively polarized to facilitate the imaging of the first pattern and the second pattern to obtain optimal results for both patterns.

In one embodiment of the present invention, the illumination light is distinctively polarized after passing through the first region and the second region.

In another embodiment of the present invention, the polarizing filters include a first polarizing filter and a second polarizing filter which are both electrically conductive and capable of polarizing the illumination light in different orientations.

In another embodiment of the present invention, both the first polarizing filter and the second polarizing filter are wiregrid polarizers. For example, the polarizing filters have a line pitch and a line width. The line width may be smaller than 40 nm and the line pitch may be in a range between 80 to 120 nm on the reticle for an ArF laser 193 nm wavelength scanner.

In another embodiment of the present invention, the illumination light has an incident wavelength and the line pitch is smaller than the incident wavelength.

In another embodiment of the present invention, the XY positions of the first polarizing filter and the second polarizing filter respectively overlap with the XY positions of the first region and the second region of the patterned layer that is on the same side of the transparent substrate.

These and other objectives of the present invention will no doubt become obvious to those of ordinary skill in the art after reading the following detailed description of the preferred embodiment that is illustrated in the various figures and drawings.

DETAILED DESCRIPTION

The present invention in a first aspect provides a reticle with one or more polarizers to enable a new approach to obtain the best imaging results for each individual pattern. The polarizers may be a polarizing filter so that the polarization filtering of light is allowed to be done at the reticle level rather than at an earlier stage, for example, at the illuminator level.

Figure 1A:
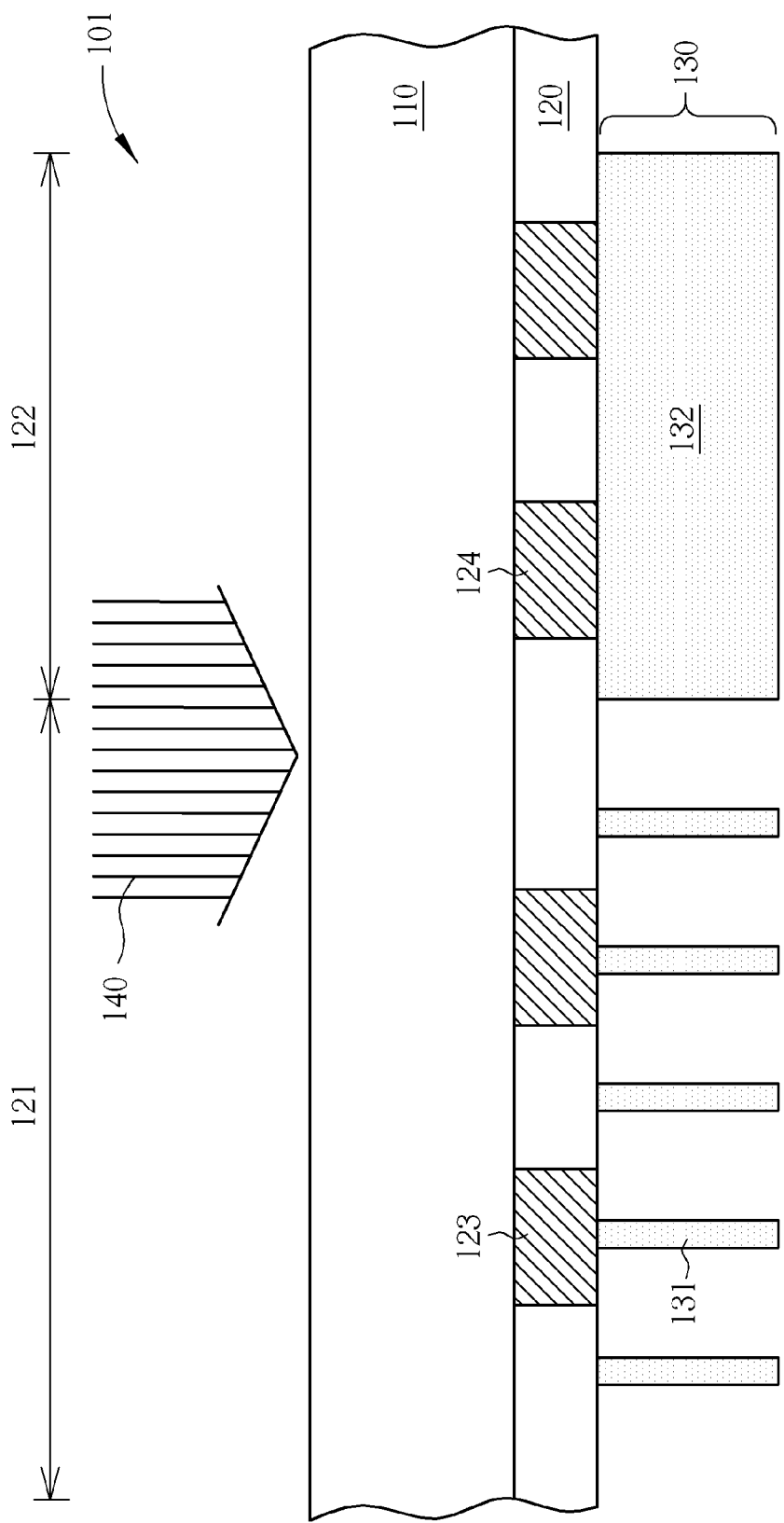
FIGS. 1A-1C illustrate different embodiments of the polarizer on a reticle according to the present invention.
Figure 1B:
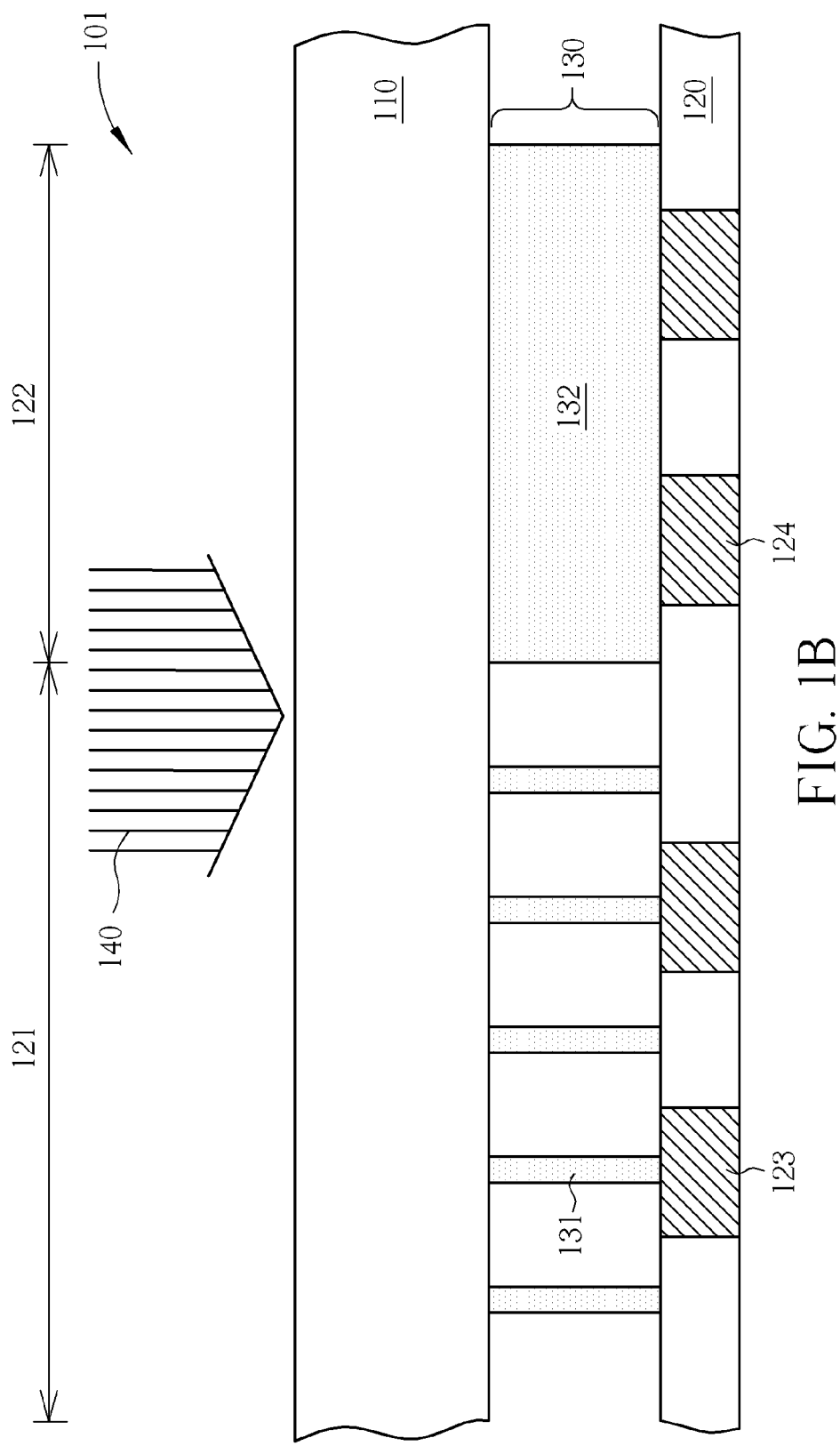
Figure 1C:
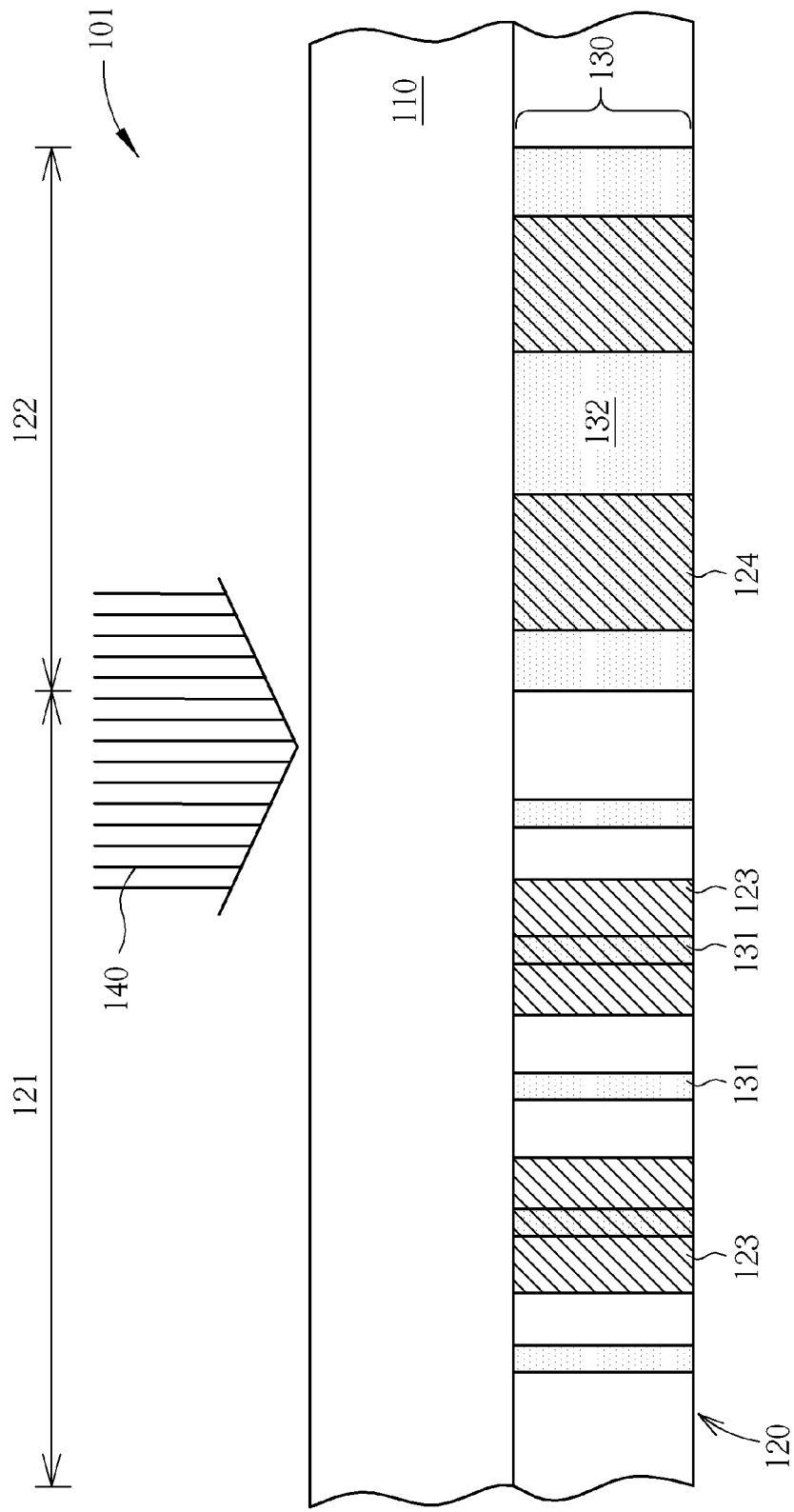
Figure 2A:
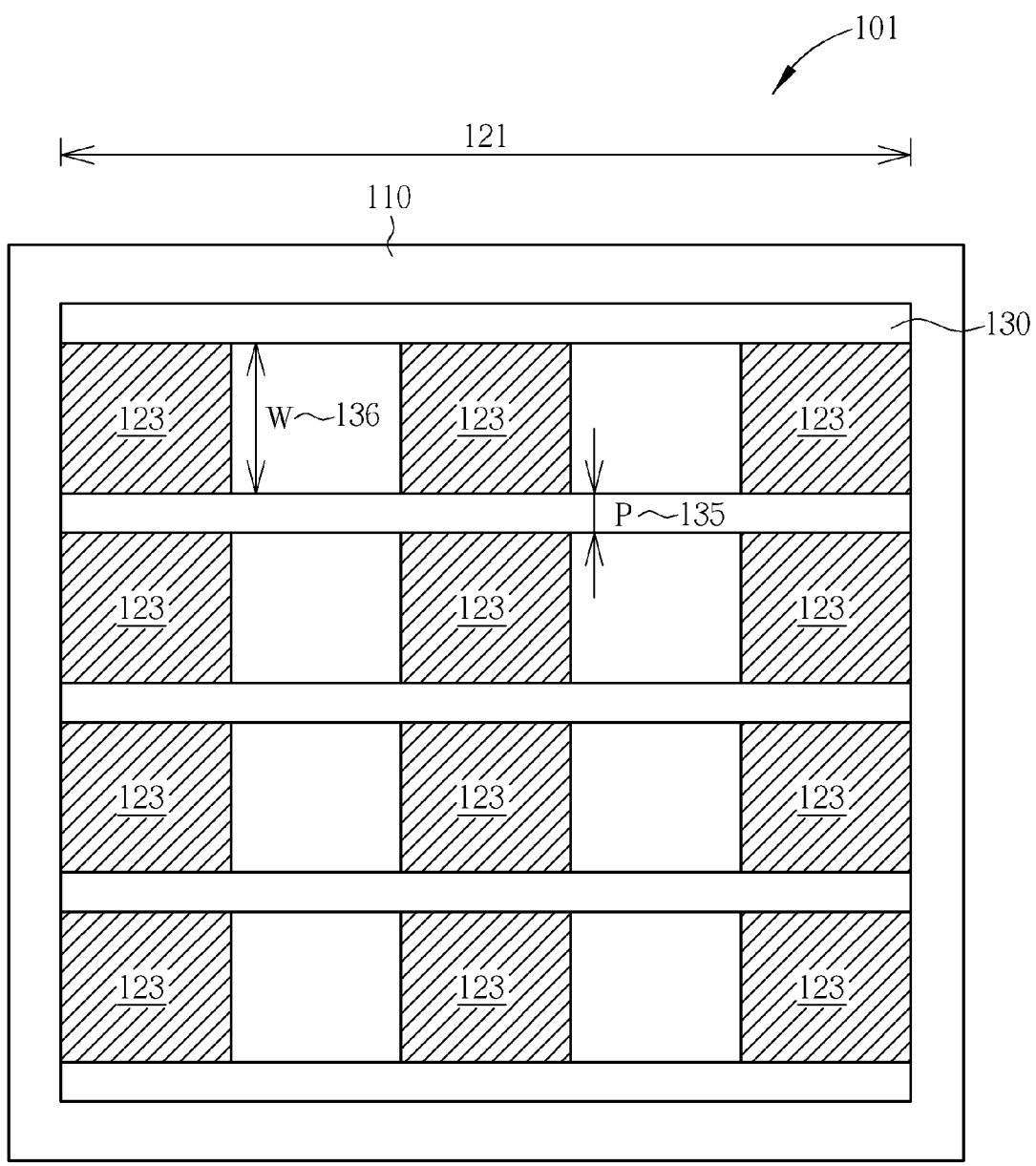
FIGS. 2A and 2B illustrate the reticle with one or more polarizers according to the present invention.
Figure 2B:
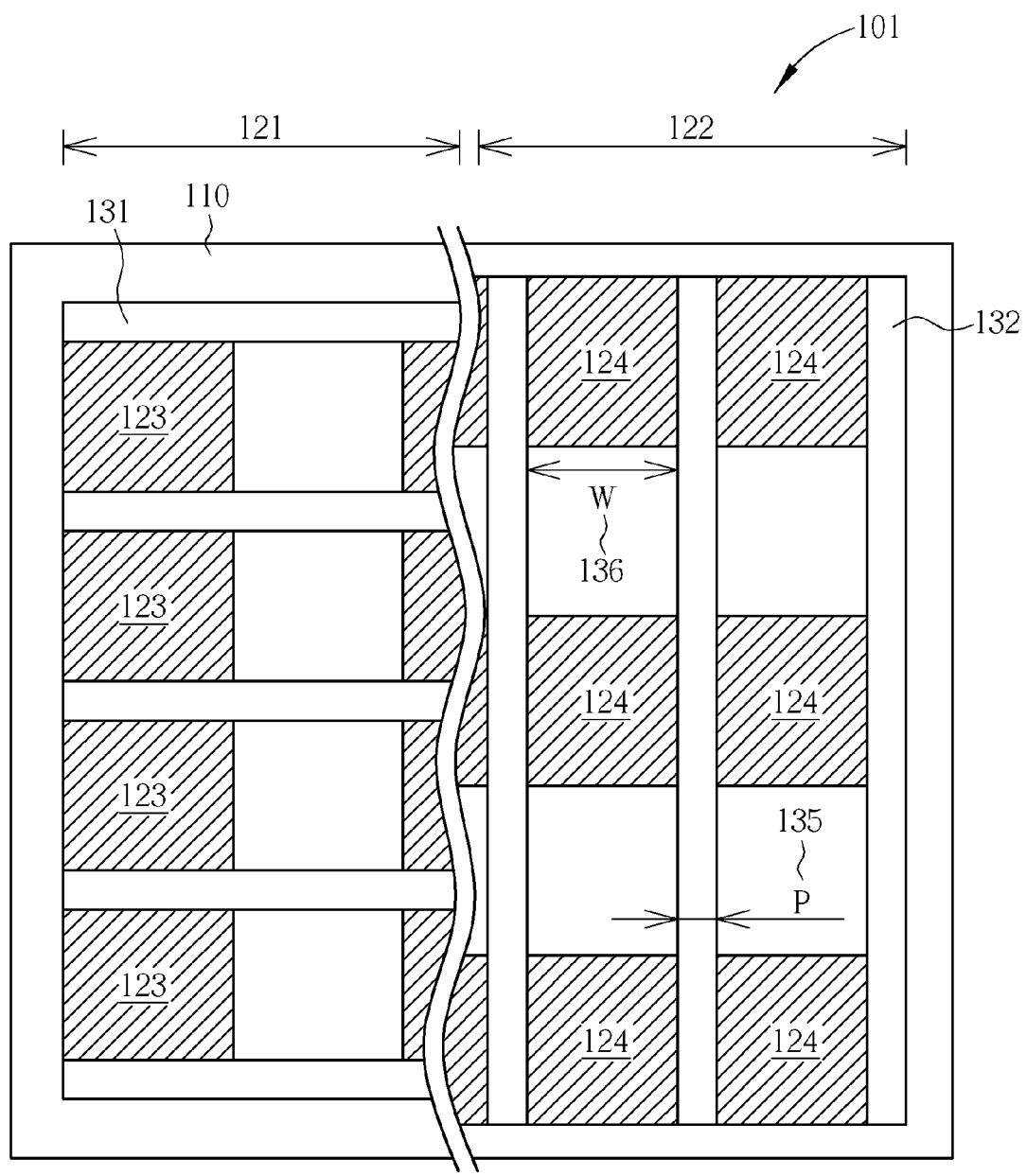

Please refer to FIGS. 1A-2, which illustrate the reticle with one or more polarizers of the present invention. In FIGS. 1A, 1B and 1C, the reticle 101 of the present invention includes a transparent substrate 110, a patterned layer 120, and one or more polarizing filters 130. The present invention incorporates one or more polarizers 130 into the reticle imaging plane. It is possible that one or more polarizing filters 130 can be localized to distinct regions on a reticle 101, for example, in FIG. 2B, the left half region of the reticle 101 that contains horizontal Line/Space patterns (pattern 123), and the right half region that contains vertical Line/Space patterns (pattern 124), may be two distinct pattern regions, i.e. different regions with different patterns. Two localized polarization states can simultaneously optimize imaging at both regions. To implement, one or more localized polarizers 130 can be used to polarize incoming light 140 of a pre-determined wavelength differently, as the light illuminates these distinct reticle pattern regions.

In some cases, illumination light polarized to be TM component rich may be better for imaging results in a particular pattern region than using TE alone or TM and TE components together. In even more general cases, whatever polarization that provides light having the best interferences off diffraction orders forming wafer patterns rather than creating intensity noise is preferred.

The substrate 110 may be a material, for example Quartz, which is transparent with respect to the particular wavelength of the light 140. The substrate 110 may have a thickness, for example 0.25 inch.

The patterned layer 120 is disposed on the transparent substrate 110. For binary photo masks, the patterned opaque 120 layer is substantially opaque with respect to illumination light 140. For example, the opaque patterned layer 120 may be made of Cr. For attenuated phase shifting photo masks, the patterned layer 120 is made to a desired transparency with respect to illumination light 140. For example, it may allow only 6% of light 140 passing through the layer or allow as much as 40% of light 140 passing through. It usually shifts the phase angle of the pass-through light, for example, by 180 degrees. The patterned layer 120 that is partial transmissive may be made of MoSi.

In addition, the patterned layer 120 may have one or more regions. For example, if the patterned layer 120 has one region, as shown in FIG. 2A, the patterned layer 120 may have a region 121 of a pattern 123. If the patterned layer 120 has more regions, as shown in FIG. 2B, the patterned layer 120 may have a first region 121 of a first pattern 123 and a second region 122 of a second pattern 124. Preferably, the second pattern 124 is different from the first pattern 123. Also, the patterned layer 120 may have more than two regions.

Please refer to FIGS. 1A, 1B, 1C. The polarizing filter layer 130 is disposed on the same top-down side of the transparent substrate 110 via three possible process options: immediately below (FIG. 1A), immediately above (FIG. 1B), or within the patterned layer 120 (FIG. 1C). The patterned layer 120 has more regions, such as a first region 121 of a first pattern 123 and a second region 122 of a second pattern 124.

Please refer to FIGS. 1A, 1B, 1C, 2A and 2B again, showing a polarizing filter layer 130 with one or more polarizing filters 131/132 disposed on the transparent substrate 110 to polarize the illumination light 140. One or more polarizing filters 131/132 need be electrically conductive in order to polarize light. For example, as shown in FIG. 2A, there may be only one polarizing filter 130 on the transparent substrate 110. Alternatively, as shown in FIG. 2B, there may be more polarizing filters, such as two different polarizing filters 131/132. Preferably, the polarizing filter 131 is different from the polarizing filter 132 in some aspects, for instance different orientations, so that the orientation of the polarizing filter 131 is normal to that of the polarizing filter 132. There may also be more than two polarizing filters on the transparent substrate 110.

In one embodiment of the present invention, at least one of the polarizing filters 131 and 132 is a wire-grid polarizer. A wire-grid polarizer usually has a line pitch 135 and a line width 136. The line width 136 may be smaller than 40 nm and the line pitch 135 may be in a range between 80 to 120 nm. Generally speaking, if the polarizing filters 131 and 132 need to be functional, the line pitch 135 should be much smaller than the incident wavelength of the illumination light (not shown), 193 nm for example.

If the patterned layer 120 has a first region 121 and a second region 122, the first polarizing filter 131 may XY-overlap with the first region 121 and the second polarizing filter 132 may XY-overlap with the second region 122. layer 130 containing the first polarizing filter 131 and the second polarizing filter 132 may be formed before or after the patterned layer 120 is formed but it needs to be adjacent to the patterned layer 120.

Due to the required small dimension of the line width W of the wire grids, the printing of the polarizing filter is beyond the current mask writers' capability. The polarizing filter may be formed on the transparent substrate 110 and with the patterned layer 120 using several sub-resolution process techniques. Some examples may include pitch multiplication, nano-imprint, two-beam interferometer, dedicated Line/Space e-beam writer, or Block Co-polymer process. A pitch multiplication technique is illustrated in FIGS. 3-8, to provide a step-by-step example of the sub-resolution processes for forming the polarizing filter of the present invention.

FIGS. 3-8 will form the polarizing filter layer option given in FIG. 1A (polarizing filter immediately below the pattern layer). Please keep in mind that during the mask manufacturing process, mask substrate is faced up with the pattern layer and polarizing filter layer on the top. While during wafer exposures in a photo scanner, the mask substrate is faced down with the pattern layer and polarizing filter layer at the bottom.

Figure 3:
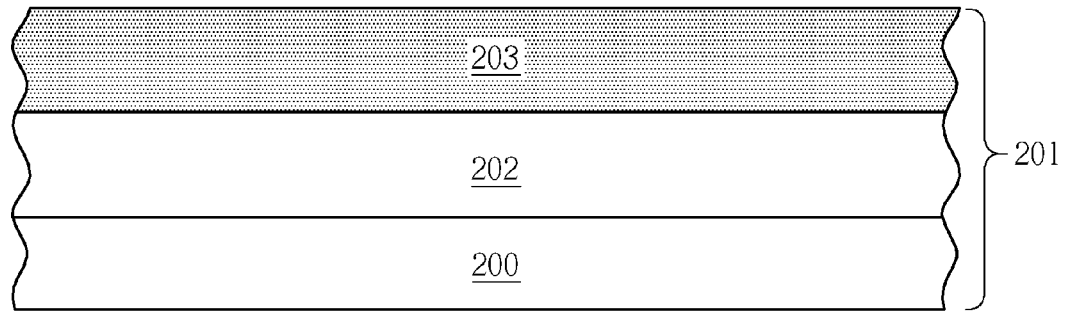
FIGS. 3-8 illustrate the steps of forming the polarizing filter of the present invention.

First, without losing the generality of the following description of the pitch multiplication process, a regular reticle blank 201 is provided in FIG. 3. A reticle blank is the un-patterned photo mask supplied (by blank vendors) to a mask shop for writing reticles so it consists of a Quartz substrate 200 and an either a Mosi layer 202 and/or a Cr layer 203 depending on if it is a binary blank or an attenuated phase shifting blank. For the purposes of the present invention, the reticle blank 201 may have multiple material layers disposed thereon.

Figure 4A:
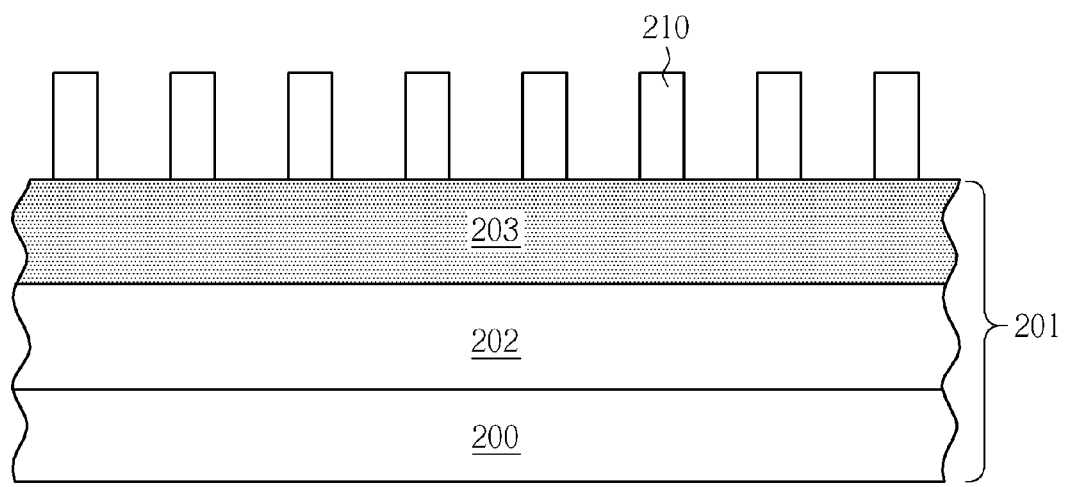
Figure 4B:
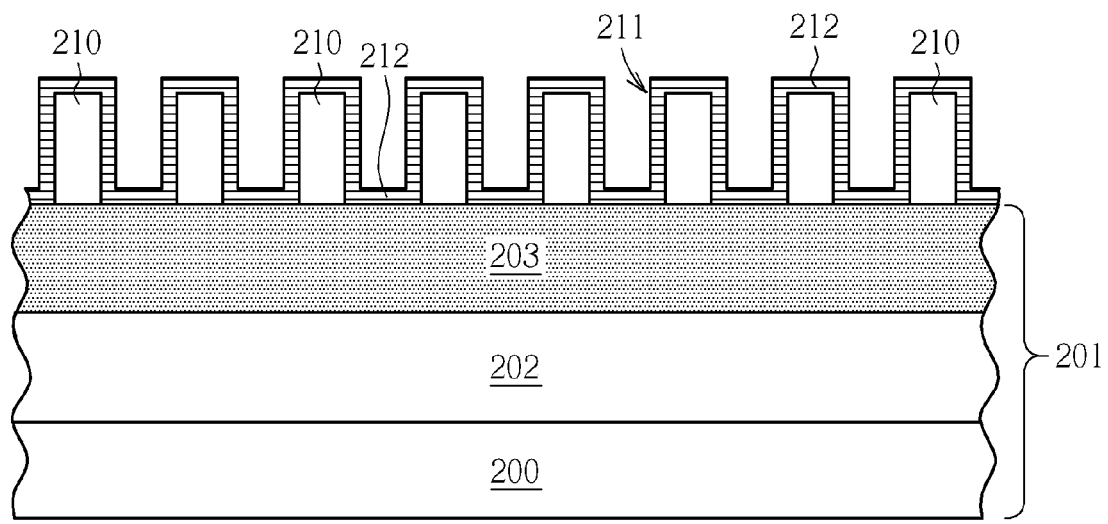
Figure 4C:
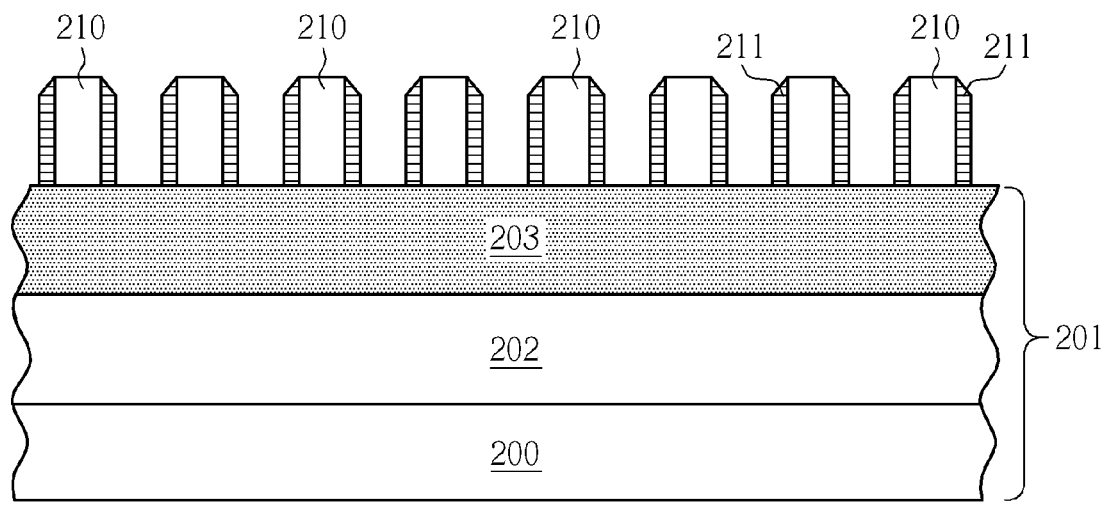
Figure 4D:
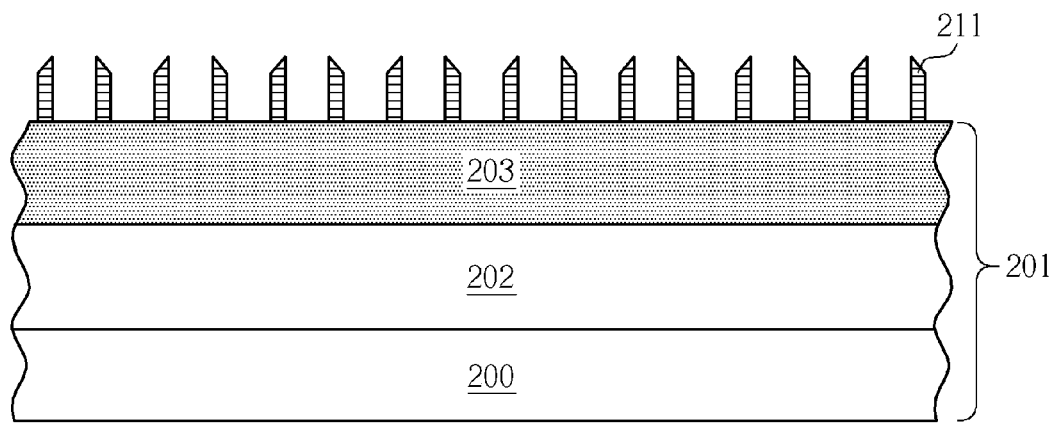
Figure 4E:
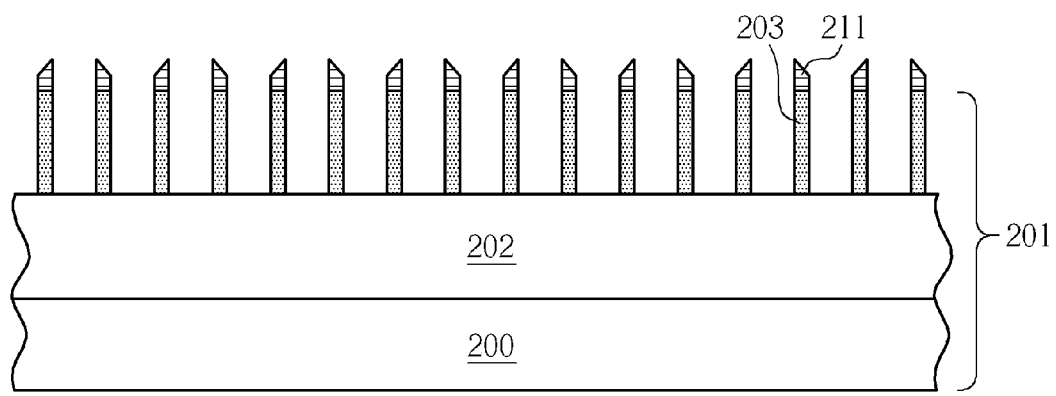
Figure 5:
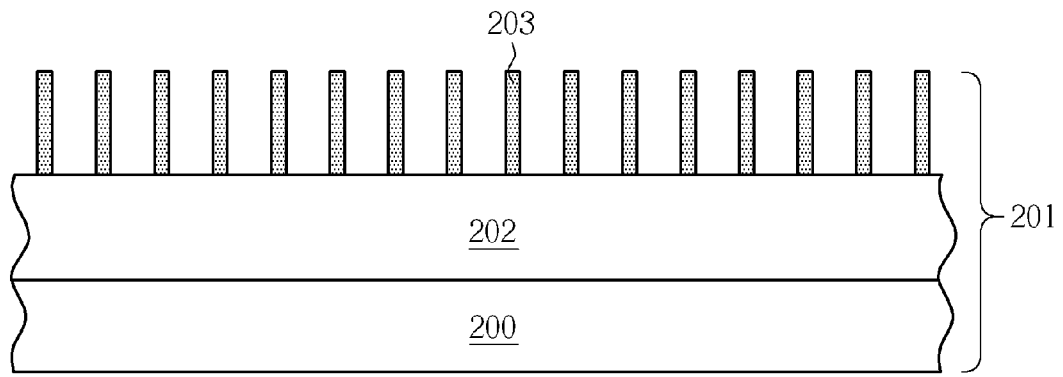

Next, the Cr layer 203 is about to be patterned to have spacer patterns at a desired pitch. For example, first as shown in FIG. 4A, an e-beam resist layer 210 is formed on the reticle blank 201, and is patterned with lines and spaces at double the desired pitch for the wire grid polarizer pattern. Second, as shown in FIG. 4B, a conformal film 211, such as a silicon oxide, is formed over the e-beam resist layer 210 with these doubled features and horizontal surfaces 212. Then, as shown in FIG. 4C, the conformal film 211 is etched anisotropically to remove the horizontal surfaces 212, leaving the film 211 on the sides of the e-beam resist layer 210. Next, as shown in FIG. 4D, a second etch step totally removes the e-beam resist layer 210, leaving spacer patterns at the desired pitch. Later, the spacer patterns at the desired pitch are transferred onto the underlying Cr layer 203 by another etching step, as shown in FIG. 4E, and followed by the removal of the remaining e-beam resist layer 210 to obtain the Cr layer 203 with the spacer patterns at the desired pitch, as shown in FIG. 5.

Figure 6:
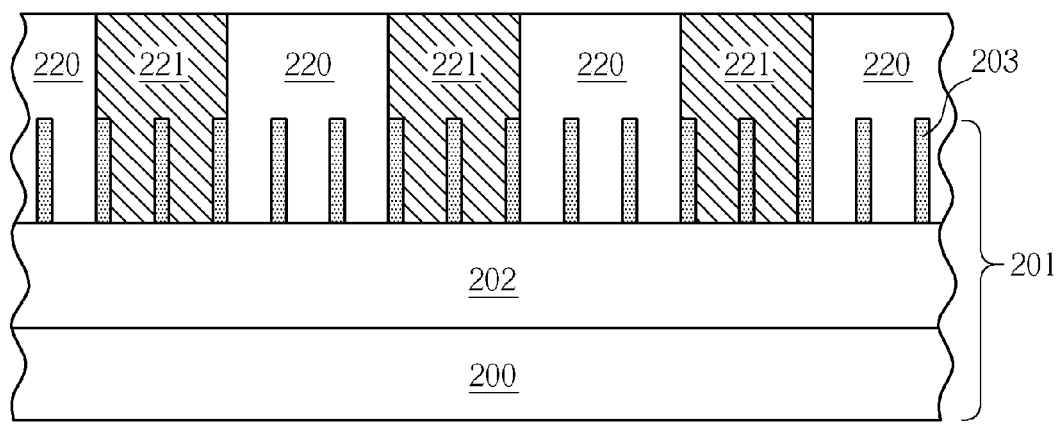
Figure 7:
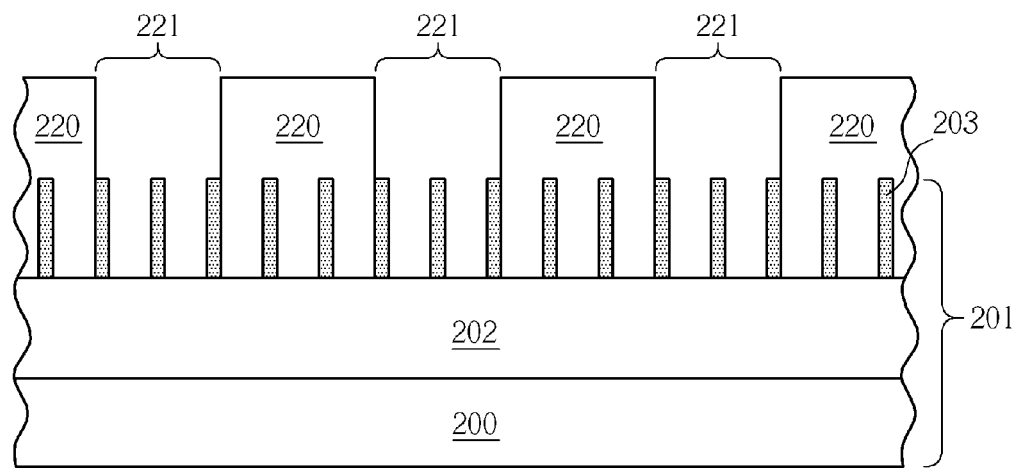
Figure 8:
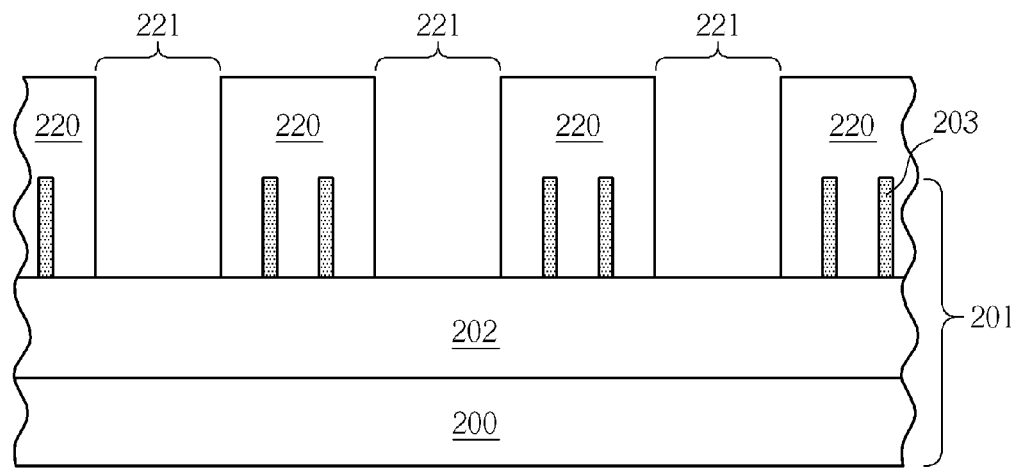

Next, the pattern of the reticle 101 is formed in the following steps. For example, as shown in FIG. 6, an e-beam resist 220 is formed on the Cr layer 203 by spin coating. Later, as shown in FIG. 6, the e-beam resist 220 undergoes an exposure process to have a pre-determined pattern 221 by a second e-beam write. Afterwards, as shown in FIG. 7, the e-beam resist 220 undergoes a development process to reveal the pre-determined pattern 221. Continuing, as shown in FIG. 8, both the Cr layer 203 (with the wire grid polarizer pattern) and the Mosi layer 202 are etched in the presence of the pre-determined pattern 221 to obtain a reticle 201 equipped with a built-in wire-grid polarizer.

The present invention in a second aspect provides a method of simultaneous optimization of imaging of a set of different patterns without the need for a special illumination source. First, as shown in FIGS. 1A, 1B and 1C, a reticle 101 and illumination light 140 are provided. The reticle 101 may include a transparent substrate 110, a patterned layer 120, and one or more polarizing filters 131 and 132 in the layer 130.

The patterned layer 120 may include Cr or MoSi. The patterned opaque 120 layer is substantially opaque with respect to the illumination light 140 if it is made of Cr, or partially transmissive if it made of MoSi, but the substrate 110 is transparent with respect to the particular light 140.

In addition, the patterned layer 120 may have one or more regions. For example, if the patterned layer 120 has one region, the patterned layer 120 may have a region 121 of a pattern 123. If the patterned layer 120 has more regions, the patterned layer 120 may have a first region 121 of a first pattern 123 and a second region 122 of a second pattern 124. Preferably, the second pattern 124 is different from the first pattern 123. Also, the patterned layer 120 may also have more than two regions.

Please refer to FIGS. 2A and 2B, showing one or more polarizing filters 131 and 132 in the polarizing filter layer 130 disposed on the transparent substrate 110 to partially filter a illumination light (not shown). One or more polarizing filters 130/131/132 may be metallic to block some of the illumination light (not shown). For example, as shown in FIG. 2A, there may be only one polarizing filter 130 on the transparent substrate 110. Alternatively, as shown in FIG. 2B, there may be more polarizing filters, such as polarizing filters 131/132. Preferably, the polarizing filter 131 is different from the polarizing filter 132 in some aspects, for instance different orientations, so that the orientation of the polarizing filter 131 is normal to that of the polarizing filter 132. The polarizing filter 131 and the polarizing filter 132 may respectively generate a dipole X and a dipole Y in different regions of a mask (not shown) when the illumination light (not shown) reaches the mask (not shown). There may also be more than two polarizing filters on the transparent substrate 110.

In one embodiment of the present invention, at least one of the polarizing filters 131/132 is a wire-grid polarizer. A wire-grid polarizer usually has a line pitch 135 and a line width 136. The line width 136 may be smaller than 40 nm and the line pitch 135 may be in a range between 80 to 120 nm. Generally speaking, for the polarizing filters 131/132 to be functional, the line pitch 135 should be much smaller than the incident wavelength of illumination light (not shown), 193 nm for example.

If the patterned layer 120 has a first region 121 and a second region 122, the first polarizing filter 131 may overlap with the first region 121 and the second polarizing filter 132 may overlap with the second region 122. The first polarizing filter 131 and the second polarizing filter 132 may be disposed on different XY locations of the transparent substrate 110 but respectively locally adjacent to the patterned layer 120 in the Z (thickness) direction.

Figure 9A:
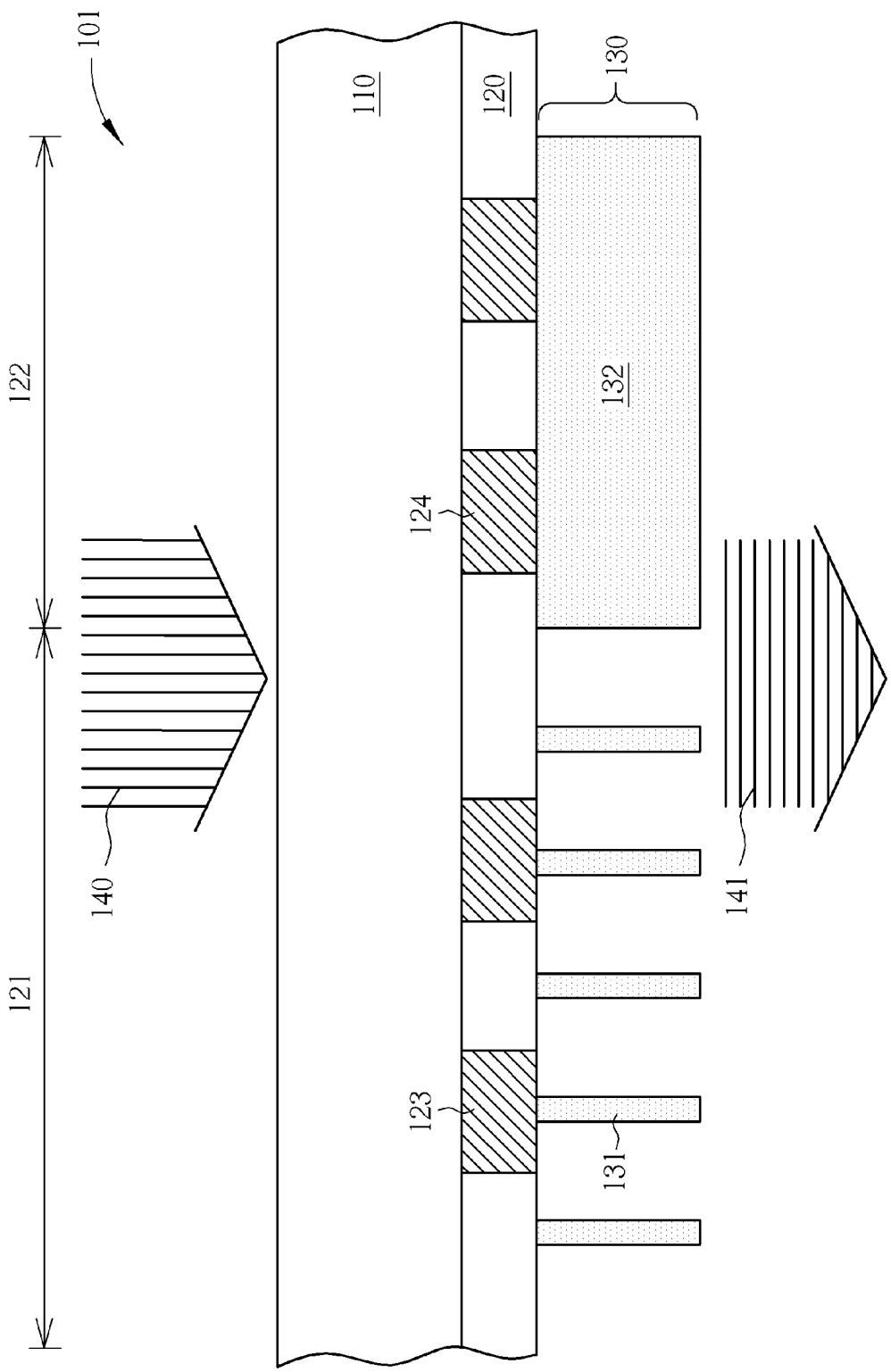
FIG. 9A-9C illustrate different embodiments of a method of simultaneous optimization of imaging of a set of different patterns of the present invention.
Figure 9B:
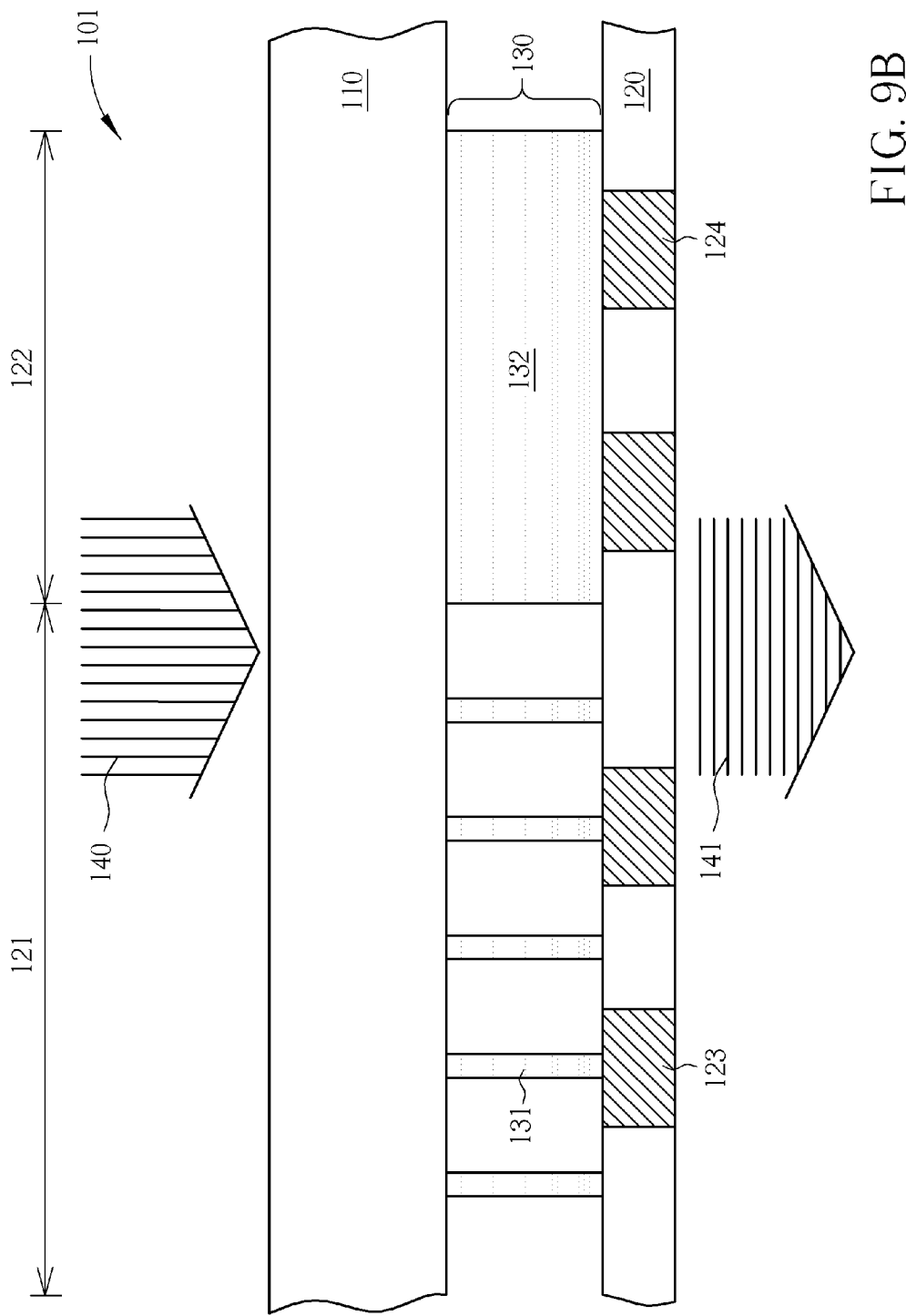
Figure 9C:
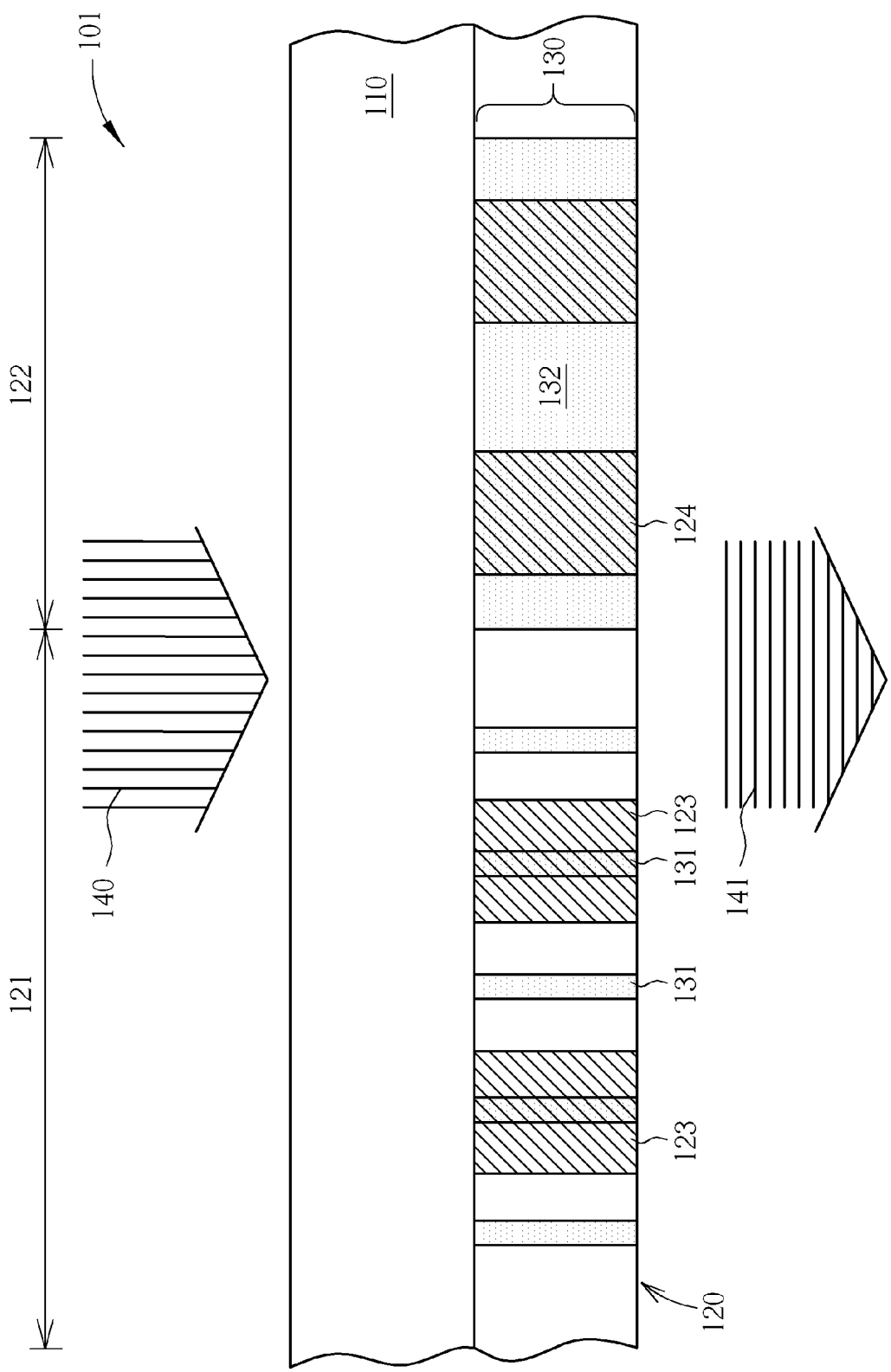

FIGS. 9A, 9B and 9C shows the three possible arrangements of the patterned layer 120 and the polarizing filter layer 130. For example, the layer of polarizing filter is adjacently below (FIG. 9A), adjacently above (FIG. 9B), and within the same layer of the patterned layer. The illumination light 140 passes through the substrate 110 and arrives at the polarizing filters 131 or the polarizing filters 132, and the patterned layer 120 optically simultaneously. The illumination light 140 may be an unpolarized illumination having both the TM component and the TE component.

After passing through the reticle 101, the illumination light 140 is selectively polarized to be a polarized light 141; for example to be TM component rich. The polarized light 141 may facilitate the imaging of the first pattern 123 and/or the second pattern 124 as if a special illumination were used, such as a dipole illumination or a quadrupole illumination.

In one aspect, the present invention can enable significant imaging improvements for layers with a combination of 1-D and 2-D patterning. In another aspect, the present invention can allow several layers that currently use double-exposures to run with a single-exposure.

Those skilled in the art will readily observe that numerous modifications and alterations of the device and method may be made while retaining the teachings of the invention.

What is claimed is:

1. A reticle with a composite polarizer, comprising:
   a transparent substrate;
   a patterned layer disposed on one side of said transparent substrate, and outside of said transparent substrate; and
   a polarizing filter disposed on the same side of said transparent substrate and in direct contact with said patterned layer, wherein said transparent substrate is substantially transparent with respect to a illumination light, said patterned layer is at least substantially partially opaque with respect to said illumination light, only one of said polarizing filter and said patterned layer is in direct contact with said transparent substrate, and said polarizing filter is capable of selectively polarizing said illumination light and the position of said polarizing filter is one of immediately below and immediately above said patterned layer so that light passes through said transparent substrate before passes through said patterned layer.

2. The reticle with a composite polarizer of claim 1, wherein said polarizing filter is electrically conductive.

3. The reticle with a composite polarizer of claim 2, wherein said polarizing filter is a wire-grid polarizer.

4. The reticle with a composite polarizer of claim 2, wherein a layer of said polarizing filter is adjacent to or within the layer of said patterned layer on said transparent substrate.

5. The reticle with a composite polarizer of claim 1, wherein said polarizing filter has a line pitch and a line width.

6. The reticle with a composite polarizer of claim 5, wherein said illumination light has an incident wavelength and said line pitch is smaller than said incident wavelength.

7. The reticle with a composite polarizer of claim 5, wherein said line width is smaller than 40 nm.

8. The reticle with a composite polarizer of claim 5, wherein said line pitch is 80 to 120 nm.

9. A reticle with a composite polarizer, comprising:
   a transparent substrate;
   a patterned layer disposed on one side of said transparent substrate, and outside of said transparent substrate; and
   a plurality of polarizing filters disposed on the same side of said transparent substrate and in direct contact with said patterned layer, wherein said transparent substrate is substantially transparent with respect to a illumination light, said patterned layer is at least substantially partially opaque with respect to said illumination light, said polarizing filters and said patterned layer are of the same length in a direction extending from the transparent substrate, and said polarizing filters are capable of polarizing said illumination light and the position of said polarizing filters is one of immediately below and immediately above said patterned layer so that light passes through said transparent substrate before passes through said patterned layer.

10. The reticle with a composite polarizer of claim 9, wherein said polarizing filters comprise a first polarizing filter and a second polarizing filter which are electrically conductive.

11. The reticle with a composite polarizer of claim 10, wherein at least one of said first polarizing filter and said second polarizing filter is a wire-grid polarizer.

12. The reticle with a composite polarizer of claim 10, wherein a layer of said first polarizing filter and said second polarizing filter respectively are adjacent to or within the layer of said patterned layer on said transparent substrate.

13. The reticle with a composite polarizer of claim 10, wherein said first polarizing filter and said second polarizing filter have different orientation.

14. The reticle with a composite polarizer of claim 10, further comprising:
   a first region of a first pattern disposed within said patterned layer and having said first polarizing filter; and
   a second region of a second pattern disposed within said patterned layer and having said second polarizing filter, wherein said first pattern and said second pattern are different.

15. The reticle with a composite polarizer of claim 9, wherein said polarizing filters have a line pitch and a line width.

16. The reticle with a composite polarizer of claim 15, wherein said illumination light has an incident wavelength and said line pitch is smaller than said incident wavelength.

17. The reticle with a composite polarizer of claim 15, wherein said line width is smaller than 40 nm.

18. The reticle with a composite polarizer of claim 15, wherein said line pitch is 80 to 120 nm.

* * * * *